US007769062B2

(12) United States Patent
Lu et al.

(10) Patent No.: US 7,769,062 B2
(45) Date of Patent: Aug. 3, 2010

(54) QUANTUM DOT BASED SEMICONDUCTOR WAVEGUIDE DEVICES

(75) Inventors: Zhenguo Lu, Ottawa (CA); Jiaren Liu, Ottawa (CA); Sylvain Raymond, Ottawa (CA); Philip Poole, Ottawa (CA); Pedro Barrios, Ottawa (JP); Daniel Poitras, Ottawa (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 12/076,618

(22) Filed: Mar. 20, 2008

(65) Prior Publication Data

US 2009/0238228 A1    Sep. 24, 2009

(51) Int. Cl.
*H01S 3/10* (2006.01)
*H01S 3/091* (2006.01)

(52) U.S. Cl. .................... 372/23; 372/21; 372/70

(58) Field of Classification Search .............. None
See application file for complete search history.

(56) References Cited

U.S. PATENT DOCUMENTS 7,015,498 B2 *   3/2006   Ebe et al. ........................ 257/14
2002/0126346 A1 *   9/2002   Suzuki et al. .................. 359/123
2003/0063647 A1 *   4/2003   Yoshida et al. ................ 372/50

OTHER PUBLICATIONS

G. Ortner, et al., "External cavity InAs/InP quantum dot laser with a tuning range of 166 nm," Applied Phys. Lett., vol. 88, pp. 121119, 2006.

C. Ni, et al.,"External-cavity quantum-dot laser tunable through 1.55 um," Applied Phys. Lett., vol. 88, pp. 113109, 2006.

T. Akiyama, et al., "An Ultrawide-Band Semiconductor Optical Amplifier Having an Extremely High Penalty-Free Output Power of 23 dBm Achieved with Quantum Dots." IEEE Photonics Technol. Lett., vol. 18. pp. 1614-1616, 2005.

C. Ni, et al., "InAs self-assembled quantum-dot lasers grown on (100)InP," Applied Phys. Lett., vol. 80, pp. 3629-3631, 2002.

M.J. Chawki, et al. "All fibre, 1.5um widely tunable single frequency and narrow linewidth semiconductor ring laser with fiber Fabry-Perot filter," Electron. Lett., pp. 2034-2035, vol. 29, No. 23, Nov. 11, 1993.

G.A. Sefler and K. Kitayama, "Frequency Comb Generation by Four-Wave Mixing and the Role of Fiber Dispersion," J. Lightwave Technol. pp. 1596-1605, vol. 16, No. 9, Sep. 9, 1998.

(Continued)

*Primary Examiner*—Minsun Harvey
*Assistant Examiner*—Sean Hagan
(74) *Attorney, Agent, or Firm*—Raffoul Brion (57) ABSTRACT

Methods and devices for providing a multiwavelength laser which may be used for multicasting and other optical communications uses. The present invention provides a quantum dot based multiwavelength laser with a monolithic gain block. The Fabry-Perot gain block has both upper and lower InP cladding layers. The laser system has a middle quantum dot layer with multiple stacked layers of InAs quantum dots embedded in InGaAsP. When provided with a CW injection current, the laser system produces an output spectra with equally spaced multiple emission peaks. With an input optical data signal applied to the laser system, the laser system duplicates the data in the input signal across multiple different wavelengths.

20 Claims, 6 Drawing Sheets

OTHER PUBLICATIONS

S. Yamashita and G. Cowle, "Bidirectional 10-GHz Optical Comb Generation with an Intracavity Fiber DFB Pumped Brillouin/Erbium Fiber Laser," IEEE Photonics Technol. Lett., pp. 796-798, vol. 10, No. 6, Jun. 1998.

T. Saitoh, et al.,"Proposal of a Multiplex Optical Frequency Comb Generation System," IEEE Photonics Technol. Lett., pp. 287-289, vol. 8, No. 2, Feb. 1996.

Z.G. Lu, et al., "Frequency Comb Generation by cascade cavity-enhanced four-wave mixing in a semiconductor optical amplifier." Microwave and Optical Technol. Lett., pp. 134-137, vol. 23, No. 3, Nov. 5, 1999.

Z.G. Lu, et al. "Highly Efficient non-degenerate four-wave mixing process in InAs/InGaAsP Quantum Dots," pp. 1-2, Electronic Letters, vol. 42, No. 19, Sep. 2006.

Z.G. Lu, et al., "Tunable Wavelength Conversion in a Semiconductor-fiber Ring Laser," IEEE Photon. Technol. Lett., pp. 806-808, vol. 11, No. 7, Jul. 1999.

T. Akiyama, et al., "Nonlinear processes responsible for nondegenerate four-wave mixing in quantum dot amplifiers," pp. 1753-1755, Appl. Phys. Lett., vol. 77, No. 12, Sep. 18, 2000.

T. Akiyama, et al., "Symmetric Highly Efficient (~0 dB) Wavelength Conversion based on Four-Wave mixing in Quantum Dot Optical Amplifiers," IEEE Photon. Technol. Lett., pp. 1139-1141, vol. 14, No. 8, Aug. 2002.

H. Su, et al., "Nondegenerate Four-Wave mixing in Quantum Dot Distributed Feedback Lasers," IEEE Photon. Technol. Lett., pp. 1686-1688, vol. 17, No. 8, Aug. 2005.

\* cited by examiner

QUANTUM DOT BASED SEMICONDUCTOR WAVEGUIDE DEVICES

TECHNICAL FIELD

The present invention relates to optical communications. More specifically, the present invention relates to methods and devices for providing a quantum dot based multiwavelength laser system which may be used for a multicasting system and wavelength-division-multiplexed passive optical networks (WDM-PON).

BACKGROUND OF THE INVENTION

Dense wavelength division multiplexing (DWDM) in optical networking systems offers a very efficient method of exploiting the available bandwidth in the low attenuation band of the optical fiber, which includes C-band from 1520 nm to 1565 nm, L-band from 1565 nm to 1610 nm and S-band from 1450 nm to 1520 nm, respectively. In this technology, the enormous available bandwidth is chopped into a number of parallel wavelength channels, where each channel carries data up to a maximum rate compatible with electronic interfaces. Different protocols and framing may be used on different channels. This is very similar to frequency division multiplexing (FDM) used for radio and TV transmissions.

While DWDM technology has progressed in the past few years, it can progress further. The progression of DWDM technology has increased the number of feasible channels in the total band. Early WDM systems used only 4 to 16 channels, while current and next generation systems are targeting more than 100 channels. For the transmitters of a DWDM system, there are a number of different laser sources with different wavelengths. Each data channel is modulated on one of the wavelength channels and all the wavelength channels are then multiplexed and transmitted via the same optical fiber. At the receiving end, each channel must be demultiplexed from the set of wavelength channels. An optical receiver will then demodulate data from each channel. The capacity of a DWDM system increases as many wavelength channels are provided. It is therefore desirable to thereby not only increase the number of channels but also to increase the total wavelength bandwidth.

Current laser sources used in DWDM systems are exclusively of the single-wavelength variety. Distributed Feed-Back (DFB) lasers, Fabry-Perot lasers and ring lasers are some of the main technologies for such laser sources. In these technologies, each wavelength supported in the system has a dedicated laser and its ancillary electronics. Most recently, designs are making use of tunable wavelength lasers, which have a broader spectral range and can operate at any point within that range. The primary drawback of these laser sources is the sheer number required to satisfy high channel count systems proposed for the future optical network. As a result, a simple and compact simultaneous multi-wavelength laser system (MWLS) with a high number of channels that are matched to an International Telecommunication Union (ITU) grid, low noise, large operation wavelength range, wide intensity uniformity and excellent stability is highly desirable in DWDM optical networking systems. But to date, there has not been any simple and compact MWLS with a large operation wavelength range which covers C-band, L-band, and S-band wavelengths.

In the past ten years, the use of erbium-doped fiber (EDF), bulk or quantum-well (QW) semiconductor waveguide as gain materials for simultaneous CW MWLS has been very hot research topics. Prior efforts have demonstrated MWLS oscillations with equal frequency spacing by using active overlapping linear cavities, a high birefringence fiber loop mirror, intracavity polarization hole burning or distributed Bragg grating, an elliptical fiber, intracavity tunable cascaded long-period fiber gratings or a sampled chirp fiber Bragg grating, and a self-seeded Fabry-Perot laser diode, spatial mode beating within the multimode fiber section and multicavity oscillation.

Regardless of the above efforts, through the use of bulk or QW semiconductor gain materials, some research groups have successfully generated simultaneously multi-wavelength laser outputs. Because of the relatively large homogeneous gain broadening of EDFs and bulk or QW semiconductor waveguides at room temperature, simultaneous multiwavelength lasing in these gain materials is very sensitive to variations in cavity losses. Homogeneous broadening implies that the gain provided by the EDF and bulk or QW at one wavelength uniquely determines the gain at all other wavelengths.

Any change in the wavelength dependence of cavity losses will, at some of the lasing wavelengths, typically break the requirement that the gain equal the cavity losses.

Thus, lasing stops at those wavelengths. Moreover, since the gain spectrum depends on the operating level of the gain, wavelength-independent loss variations also normally break the required gain-loss balance, with the same result. Currently reported tunable simultaneous multi-wavelength lasers therefore require careful balancing of cavity losses at each wavelength, particularly if large numbers of wavelengths are to be generated. Another problem is the covering wavelength range of the current reported MWLS is not wide enough for some special applications. It would therefore be very desirable to develop a MWLS with a stable output which covers a large wavelength range.

Optical networks, which would use the MWLS, can be viewed as a three-level hierarchy consisting of backbone networks, metro networks, and access networks. Future backbone networks provide enormous bandwidth and high data rate and could be based on DWDM and optical time-domain-multiplexed (OTDM) links. Access networks transport data to or from individual users. Metro networks play an important role by interconnecting both of them so that direct optical connections can be established. All-optical networking potentially allows high-speed optical communications to become more cost effective by the use of low-cost transparent light paths, which do not need any optical-to-electrical (O/E) and electrical-to-optical (E/O) conversions. In all optical networking systems, optical wavelength conversion is anticipated as being essential for increasing the efficiency and throughput of high-speed DWDM optical networks by enabling rapid resolution of output-port contention, lightpath failure, as well as wavelength reuse. Besides its function of removing the wavelength continuity constraint, wavelength converters may be used to promote interoperability and distribution of network control and management functions across sub-networks. A flexible and independent wavelength converter with input and output wavelength tunability will enable DWDM networks to have improved operation flexibility through a simplified wavelength-routing algorithm, reduced blocking probability, and other enhanced performance metrics.

Wavelength multicasting is another technology which would benefit from a workable MWLS as described above. Wavelength multicasting involves copying an input signal onto many different output signals such that the data can traverse parallel paths to reach the destination. Many bandwidth-intensive applications such as video distribution and teleconferencing require reliable high-speed multicasting. In a wavelength-routed DWDM network, wavelength multicasting would require an input channel to be simultaneously replicated onto multiple selected output wavelengths and would be a laudable function to achieve. Existing technologies for all-optical wavelength multicasting are in early research and development stages. These existing technologies include: 1) cross-phase modulation (XPM) and cross-gain modulation (XGM) in QW semiconductor optical amplifiers (SOAs); 2) cross-absorption modulation (XAM) in an electroabsorption modulator (EAM); and 3) XPM and four-wave mixing (FWM) in highly nonlinear fiber (HNLF). The limitations and drawbacks of the above mentioned existing wavelength multicasting systems are: the operation speed is limited by the carrier dynamics when using XGM in QW SOAs; inherent asymmetry of the wavelength conversion efficiency in their detuning characteristics when using FWM in QW SOAs; modulation format dependence exists for XGM, XAM and XPM techniques; poor noise performance and low extinction ratio, small operation wavelength range and noticeable power penalty.

It is therefore an object of the invention to provide methods and devices that overcome or at least mitigate the drawbacks and shortcomings of the prior art.

SUMMARY OF INVENTION

The present invention provides methods and devices for providing a stable and compact multiwavelength laser with over 12 wavelength channels that are matched to an International Telecommunication Union (ITU) grid, which may be used for multicasting and other optical communications uses such as WDM-PON systems. The present invention provides a quantum dot based multiwavelength laser with a monolithic gain block. The Fabry-Perot gain block between upper and lower InP cladding layers has statistically distributed sizes and geometries of self-assembled quantum dots, leading to an ultra-broad inhomogeneously broadened gain spectrum,. The laser system has a middle quantum dot layer with multiple stacked layers of InAs quantum dots embedded in InGaAsP. When provided with a CW injection current, the laser system produces an output spectra with equally spaced multiple emission peaks, which are preferably aligned to the 50-GHz or100-GHz ITU grid. The wavelength channels have extremely high optical signal-to-noise ratio and small spectral linewidth. With an input optical data signal applied to the quantum dot multiwavelength laser system, the laser system duplicates the data in the input signal across multiple different wavelengths.

In one aspect, the present invention provides a quantum-dot based multiwavelength laser system comprising:
  top and bottom cladding layers;
  a Fabry-Perot gain block between said top and bottom cladding layers to define a ridge waveguide structure, said gain block having a plurality of layers of statistically distributed sizes and geometries of self-assembled quantum dots that exhibit an ultra-broad inhomogeneously broadened gain spectrum, said gain block having:
    a first laser end facet coated with a high reflectivity coating and
    a second laser end facet coated with a partially reflective coating, said coatings having a predetermined reflectivity ratio to one another
  wherein said gain block has a predetermined cavity length based on a desired channel spacing between emission peaks of a stable multiwavelength output of said laser, said output having at least 12 channels.

In another aspect, the present invention provides a method for multicasting an optical input data signal to different optical wavelengths, the method comprising:
  a) receiving an input optical data signal at a frequency $v_0$;
  b) transmitting said input optical data signal to a quantum dot based multiwavelength laser system;
  c) receiving multiple wavelength signals which replicate data in said input optical data signal from said quantum dot based multiwavelength laser system.

BRIEF DESCRIPTION OF THE DRAWINGS

A better understanding of the invention may be obtained by reading the detailed description of the invention below, in conjunction with the following drawings, in which:

FIG. 5($a$) shows the output spectra of an InAs/InGaAsP/InP quantum dot based multiwavelength laser system (QD MWLS) with frequency spacing of 100 GHz and an OSNR of larger than 55 dB;

FIG. 5($b$) illustrates the output spectra of an InAs/InGaAsP/InP QD MWLS with a frequency spacing of 50 GHz and an OSNR of larger than 53 dB;

FIG. 5($c$) illustrates a 93-channel output spectra of an InAs/InGaAsP/InP QD MWLS with a frequency spacing of 10 GHz and within a 3-dB channel intensity non-uniformity;

DETAILED DESCRIPTION OF THE INVENTION

Figure 1:
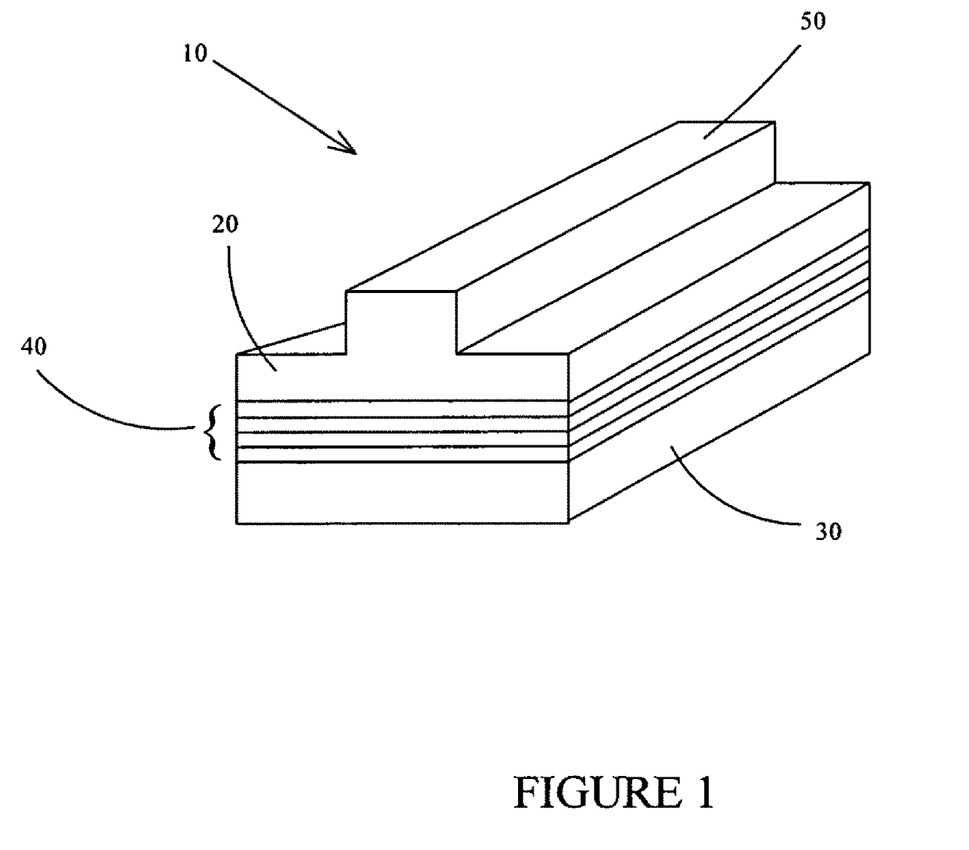
FIG. 1 illustrates a gain block of a multiwavelength laser system according to the invention.

Referring to FIG. 1, the present invention is a quantum dot based multiwavelength laser system. The laser has a gain block 10. The gain block 10 has statistically distributed sizes and geometries of self-assembled quantum dots, leading to an ultra-broad inhomogeneously broadened gain spectrum, between a top InP cladding layer 20, a bottom InP cladding layer 30, and a middle quantum dot layer 40. As can be seen from FIG. 1, the gain block 10 has a ridge waveguide structure 50. The middle quantum dot layer 40 has multiple layers of self-assembled InAs quantum dots embedded in InGaAsP as will be explained below.

In order to achieve an above mentioned desirable multiwavelength laser system (MWLS), quantum dot (QD) semiconductor waveguides were used as gain materials with a proper cavity design. QD-based semiconductors are promising materials for next-generation high-speed optical communication devices. Lasers based on QD semiconductors have already demonstrated better optical performance such as low lasing threshold current densities, small chirp at high-speed modulation, wide tunability, and passive mode-locking. The suitability of QD lasers for multi-wavelength operation with better performance derives from its qualities such as spectral hole-burning in very broad inhomogeneous gain of QDs and spatial hole-burning in a semiconductor F-P cavity.

For an InAs/InGaAsP/InP QD inhomogenously broadened gain material, as was used in one embodiment, the full width at half maximum (FWHM) of the photoluminescence (PL) is typically from 60 meV to 80 meV and the level spacing between the ground state and the excited states is from 20 meV to 30 meV and the thermal broadening of the dot states is from 7 meV to 20 meV. The emission spectra of the ground states and the excited states for different dots can overlap and laser wavelengths can provide a continuous change from ground state to excited state lasing. Eventually, the ASE of InAs/InGaAsP/InP QD gain materials would be an ultra-broad, symmetrical and continuous-changing spectrum. In one embodiment, it was observed that the 3-dB bandwidth of the ASE is up to 150 nm because the inhomogeneous broadening of gain spectrum stems from statistically distributed sizes and geometries of self-assembled QD. This provides a base for uniform, stable and large-channel-number operation of the laser. Each of lasing modes selected by a semiconductor F-P cavity extracts only electrons in QDs resonant with the wavelength of that mode, depletes electrons in these QDs with the corresponding dot sizes, and accordingly, mode gain is saturated. Because QDs are spatially isolated and only interact via wetting layers, the supply of electrons that remain in the material surrounding QDs helps the realization of ultrafast gain recovery to suppress gain fluctuation. Consequently, each mode consumes population inversion of differently localized carriers. This fast-recovery ultra-wide inhomogeneous broadening, as well as traditional spatial hole-burning inside a standing-wave cavity, will principally support multi-wavelength operation with high channel number, excellent stability, low noise and high uniformity of channel intensities.

Figure 2:
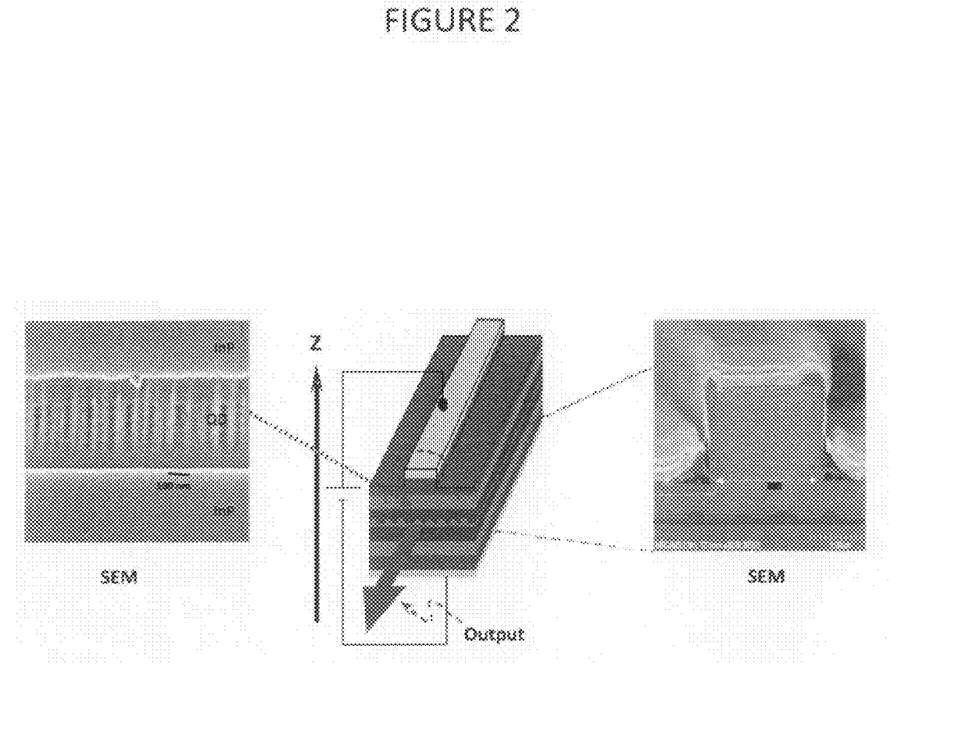
FIG. 2 illustrates the gain block of FIG. 1 with detailed scanning electron microscope images of a resulting gain block.

In one embodiment, InAs/InP p-i-n QD semiconductor gain materials were used and were grown by chemical beam epitaxy (CBE) on exactly oriented (100) InP n-type substrates. FIGS. 1 and 2 show the QD waveguide structure. FIG. 2 also shows scanning electron microscope images of the resulting device. The middle layer with the QDs embedded can be clearly seen. For this middle layer, the undoped active regions consisted of five stacked layers of self-assembled InAs QDs with 400 nm of quaternary $In_{0.816}GA_{0.184}As_{0.392}P_{0.608}$ (1.15 Q), providing three-dimensional electron confinement. From transmission electron microscopy (TEM) measurements, the QD density in each QD layer was approximately $3\times10^{10}$ cm$^{-2}$. Optical confinement in the lateral direction was achieved by a planar waveguide configuration while this aforementioned core in the vertical direction was surrounded with an n-InP bottom cladding layer and a p-InP top cladding layer. The latter cladding was covered with a cap of $p^+$-$In_{0.522}Ga_{0.478}As$ to ensure good ohmic contact to the top metal stack. In one configuration, the gain block was used in a QD semiconductor optical amplifier (SOA) with a ridge waveguide structure with 3 μm width and 3000 μm long. To prevent any optical feedback, the QD-SOA waveguide has antireflection coatings (~$10^{-3}$ reflectivity) tilted 10° on both facets.

It should be noted that while five stacked layers of self-assembled quantum dots were used in the above embodiment, as few as two layers of quantum dots may be used. As well, as many as fifty (50) layers of quantum dots may be used in the device.

Figure 3:
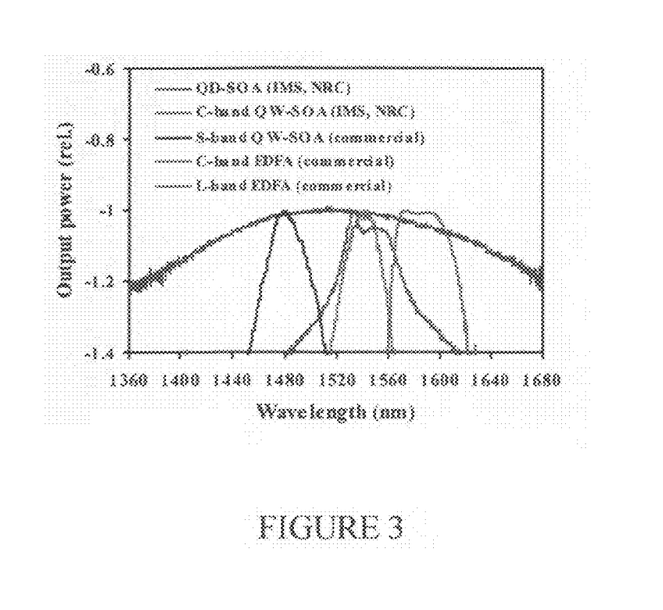
FIG. 3 shows the amplified spontaneous emission (ASE) spectra of a quantum dot based semiconductor optical amplifier according to one aspect of the invention.

FIG. 3 shows the amplified spontaneous emission (ASE) spectra of this QD-SOA. The peak wavelength of the ASE spectra was around 1520 nm. The 3-dB and 10-dB bandwidths were approximately 150 nm and 300 nm which cover all S-, C- and L-bands. FIG. 3 also shows comparison results between the present invention and same-structure QW-SOA (quantum well—semiconductor optical amplifier) and other commercial optical amplifiers such as S-band QW-SOA, C-band erbium-doped fiber amplifier (EDFA) and L-band EDFA. When the injection current of the QD-SOA was changed, its corresponding 3-dB or 10-db spectral bandwidths almost stayed the same. When the operation temperature of the QD-SOA was changed from 10° C. to 40° C., the output power and ASE spectra of the QD-SOA did not change much. For the comparable (having a similar structure) doped QW-SOA, the output power and spectra significantly changed when the operating conditions were similarly changed.

The QD MWLS of the present invention is a ridge-waveguide Fabry-Perot (F-P) cavity structure, which was cleaved perpendicularly to the diode junction plane, at a length of L. Both of the laser end facets were coated to result in a desired reflectivity ratio. The F-P cavity chip itself served as an inhomogenously broadened active gain medium, a flat-top-shape spectral bandpass filter for longitudinal modes, a polarization maintaining component, and cavity mirrors as well.

Figure 4:
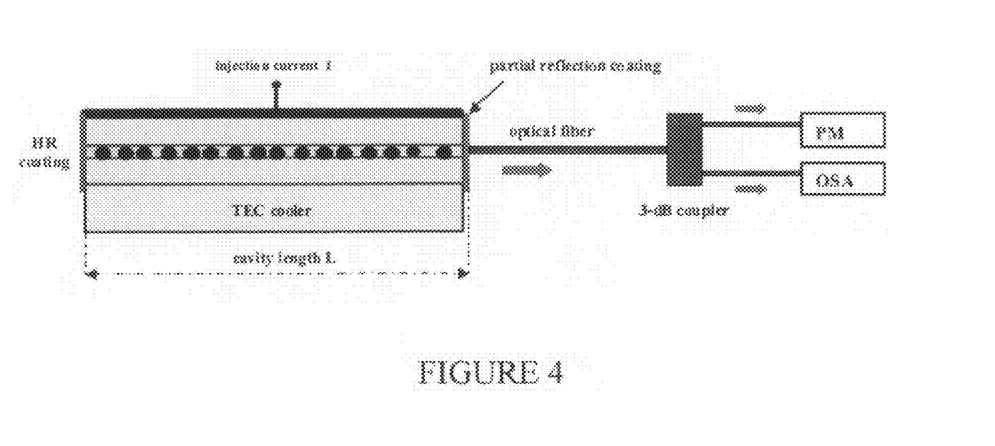
FIG. 4 is a schematic view of one embodiment of a quantum dot based multiwavelength laser system with its experimental setup.

FIG. 4 shows a schematic of one embodiment of the QD MWLS with its experimental testing set up. The laser output at one facet of the QD MWLS was coupled by a special fiber with the desired numerical aperture and mode field diameter, and sent to an optical spectrum analyzer (OSA) and a power meter (PM) through a SMF-28 fiber spliced with that special fiber. The QD MWLS sample was mounted on a TEC cooler at a room temperature, and driven by CW injection currents.

The QD-based MWLS of the present invention will have better performance than its QW-based counterpart because of its ultra-broad inhomogeneously broadened gain spectrum and much less mode competition. This results from the random spatial distribution of quantum dot sizes where each dot acts as an independent emitter at a specific wavelength. Even though complete or incomplete overlap of standing waves at different lasing wavelengths within the QD-based gain medium still exists, competition for gain between wavelengths is dramatically reduced because each lasing mode only captures gain from the specific QDs resonant with this lasing wavelength. This is not the case for quantum well (QW) lasers where significant mode competition has been observed. As a consequence, QD-based MWLSs will have much broader lasing range, and are much more stable for each lasing channel and have better lasing channel uniformity. In addition, since QD lasers have much lower linewidth enhancement factor (α) relative to QW lasers, and the linewidth of each lasing mode is proportional to $(1+\alpha^2)$, each lasing mode of QD-based MWLSs will have much smaller linewidth, resulting in an improved optical signal-to-noise ratio (OSNR). As examples of this, FIGS. 5(a), (b) and (c) show the output spectra of the present invention's QD MWLSs with three different frequency spacings.

Figure 5A:
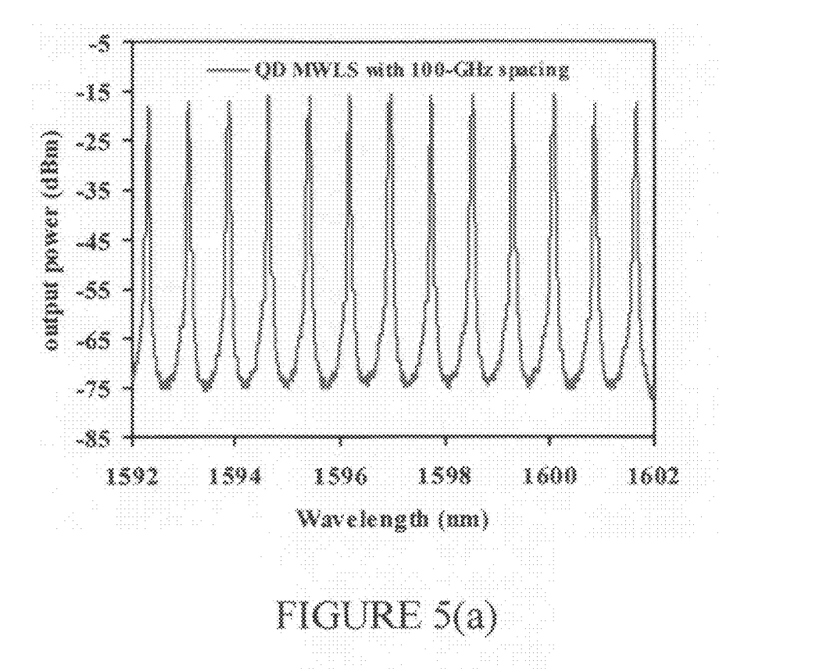
Figure 5B:
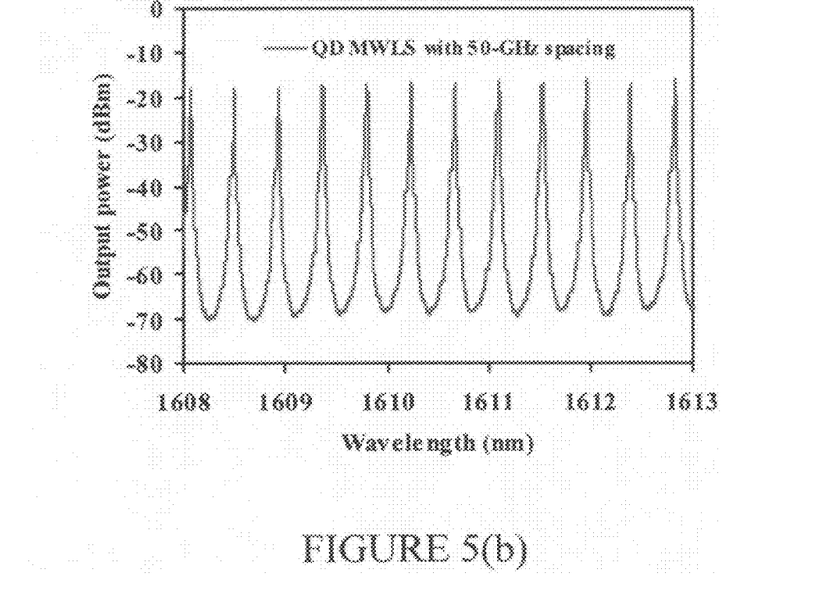
Figure 5C:
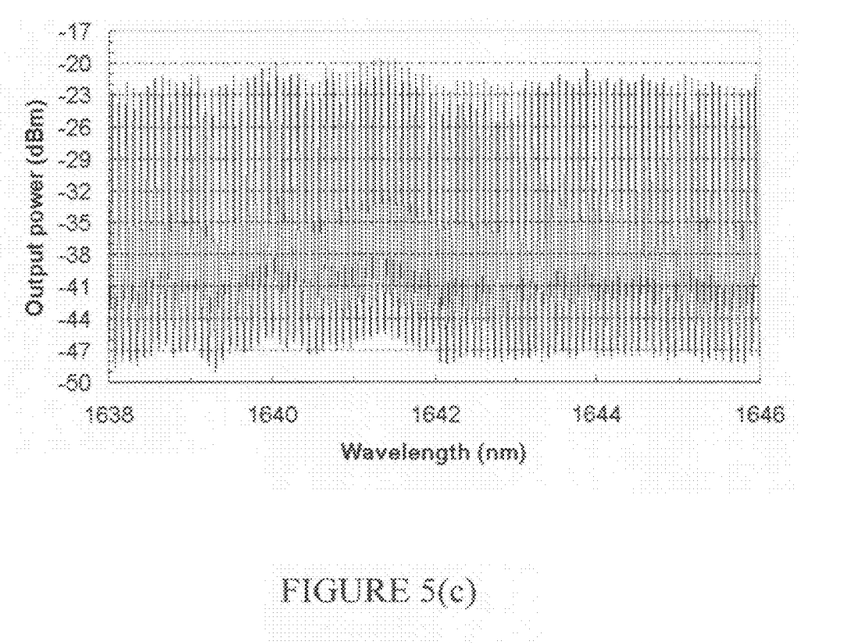

FIG. 5(a) shows the output spectra of an InAs/InGaAsP/InP QD MWLS with the frequency spacing of 100 GHz and the OSNR of larger than 55 dB over the 13 channels shown. The lasing threshold current is 65 mA. For FIG. 5(b), there is shown the output spectra of an InAs/InGaAsP/InP QD MWLS with the frequency spacing of 50 GHz and the OSNR of larger than 53 dB over the 12 channels shown. The lasing threshold current is 58 mA. FIG. 5(c) shows a 93-channel output spectra of an InAs/InGaAsP/InP QD MWLS with the frequency spacing of 10 GHz and within a 3-dB channel intensity non-uniformity.

With the QD MWLSs, the channel spacing between the emission peaks is controlled by the cavity length with the channel spacing $\Delta\lambda$ given by $$\Delta\lambda(\lambda) = \lambda^2 / [2 \cdot n_{eff}(\lambda, T, J) \cdot L]$$

where: $\lambda$ is the vacuum wavelength
T is the device temperature
J is the injection current density and
L is the cavity length The above expression outlines the fact that the effective refractive index ($n_{eff}$) depends on wavelength, temperature and current density. More importantly, this means that the channel spacing will be approximately constant and will be determined essentially by the cavity length. In this way, with a cavity length close to 0.5 mm, a channel spacing of 100 GHz (about 0.8 nm) will result. Inevitably, since it is intended to span many channels, there will be a drift in channel spacing over the wavelength range of the channel plan due to the dependence of the refractive index on wavelength. However, this drift has been measured and it has been shown that the channel-spacing inequality due to chromatic dispersion is tolerable and could be eliminated by proper QD waveguide design. For absolute lasing wavelength control, the thermal tuning coefficient of QD-based MWLSs is about 0.09 nm/K.

Depending on the channel plans, QD MWLSs may be locked to the International Telecommunication Union (ITU) grid with temperature changes of less than 5° C. This will not sacrifice the laser's other performance parameters. In order to control intensity uniformity and lasing wavelength range, through the combination of device design, growth condition adjustment and coatings, the ASE spectra of QD devices will have a 3-dB bandwidth of 150 nm at the central wavelength of 1520 nm. This covers S-, C- and L-band wavelengths. The resulting QD MWLSs will be operating within a lasing wavelength range selected by facet coatings with flat-top band shapes. Because QD lasers have a very flat gain curve vs. wavelength, the relative flat intensity should be realized for all channels. Further intensity uniformity improvement could be expected once these lasers operate far beyond the lasing threshold injection current and are saturated.

This multi-wavelength lasing operation is accomplished with a simple monolithic QD chip without any external components such as filters, polarization controllers and reflectors. Its channel spacing could be easily controlled by the precise cutting of waveguide lengths, its lasing threshold current density can be dramatically reduced by high-reflectivity coatings at one or two end facets, and its OSNR can further improved by eliminating high-order spatial modes that broaden laser mode linewidths and fill in spectral minima.

Figure 6:
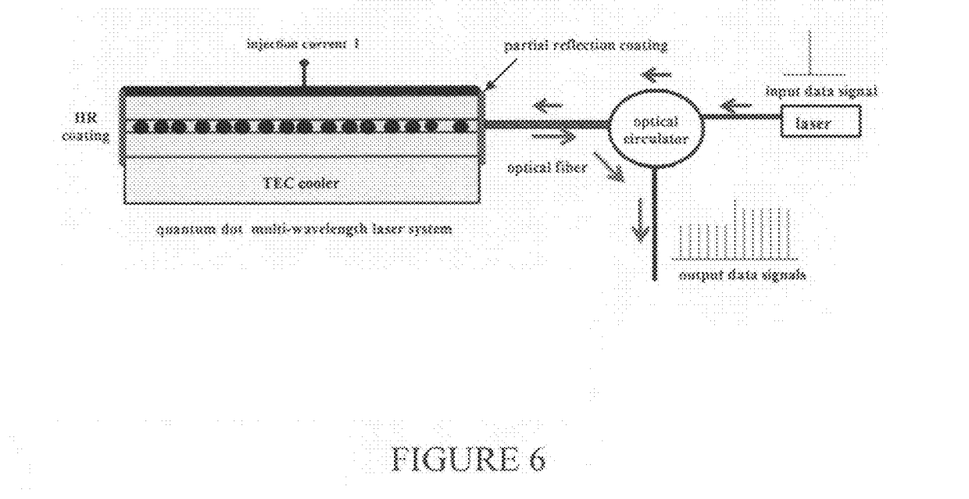
FIG. 6 is a schematic view of a quantum dot wavelength multicasting system (QD-WMCS) based on non-degenerate four-wave mixing (ND-FWM) process in a QD MWLS.

One implementation of the above noted QD MWLS is in a quantum dot wavelength multicasting system (QD-WMCS). FIG. 6 shows a schematic of a QD wavelength multicasting system (QD-WMCS) based on non-degenerate four-wave mixing (ND-FWM) process in a QD MWLS.

Referring to FIG. 6, an input laser sends an input optical data signal to an optical circulator which transmits the input data signal to a QD MWLS system as described above. As can be seen, the QD MWLS has one facet with a high reflectivity coating and another facet with a partial reflectivity coating. The QD MWLS then outputs multiple wavelength signals which replicate the data in the input data signal. This output is sent to the optical circulator and are then rerouted to their destinations.

As noted above, a QD-MWLS driven by a CW injection current is a multi-wavelength laser source with equal frequency spacing. With such a laser source, it is assumed that the frequencies produced are $v_1, v_2, v_3, \ldots v_N$ and that their frequency spacing of $v_M - v_{M-1}$ (M=1, 2, 3, ... N) is $\Delta v$. If an original input data (optical) signal with the frequency of $v_0$ is injected through an optical circulator into the QD-MWLS cavity, with the frequency difference between $v_1 - v_0$ being $\Delta v$, new frequency components would be generated. By ND-FWM process within the QD-MWLS cavity, the following new frequency components of $v_0 - K(\Delta v)$ (K=1, 2, 3, ... N) would be generated. The newly generated laser outputs with the frequency of $v_0 - K(\Delta v)$ (K=1, 2, 3, ... N) will carry the exact same data information of the original input data signal.

It should be noted that when laser light is injected into the QD laser cavity, the performance of the QD laser does not change much in terms of output power stability and values. This results because QD lasers have the unique back-reflection insensitivity property as compared with the other homogeneous gain materials such as bulk or QW semiconductor, rare-earth-doped fiber materials.

The above noted QD MWLS can therefore be used for wavelength multicasting. Optical wavelength multicasting is the simultaneous transmission of information from an optical source node to multiple destination nodes. As can be seen from FIG. 6, an original input data signal laser may be injected into a QD MWLS cavity. Using both non-degenerate four-wave mixing (NDFWM) process in QD gain waveguides and the unique back-reflection insensitivity property of QD lasers, the original input data signal is converted into multiple signals of different wavelengths. The resulting QD-WMCS is therefore able to simultaneously transmit the original data through parallel paths to different desired destinations.

Such a QD-WMCS as pictured in FIG. 6 may therefore increase the efficiency and throughput of high-speed DWDM optical networks by enabling rapid resolution of output-port contention, lightpath failure, as well as wavelength reuse. The QD-WMCS functions as a wavelength converter and promotes interoperability and the distribution of network control and management functions across subnetworks. This flexible and independent wavelength converter has a single input wavelength and many output wavelengths.

It should also be noted that the QD-MWCS will enable WDM networks to have improved operation flexibility by allowing the use of simplified wavelength-routing algorithms, reduced blocking probability, and other enhanced performance metrics.

Using the ND-FWM process in a QD MWLS allows the QD WMCS to achieve data conversion with very high operation speed, symmetrical wavelength conversion efficiency in its detuning characteristics, modulation format independence, good noise performance and extinction ratio, large operation wavelength range and small power penalty.

Regarding ND-FWM, the process may be optimized within a QD MWLS by ensuring that the state of polarization of the input data signal has to be partially or fully parallel to the state of polarization of the QD MWLS. As well, for wavelength up-conversion, ND-FWM can further be optimized by ensuring that the wavelength of the input data signal is larger (or longer) than the longest wavelength of the QD MWLS. For wavelength down-conversion, optimization can be increased by ensuring that the wavelength of the input data signal is smaller or shorter than the shortest wavelength of the QD MWLS. It should also be noted that it is desirable that the operational wavelength range of the high reflectivity coating facet of the QD MWLS gain block cover the wavelengths of both the MWLS and all ND-FWM signal wavelengths. However, for the partial reflectivity coating facet, its operational wavelength range need only cover the wavelengths of the MWLS while, for all ND-FWM signal wavelengths, the partial reflectivity coating facet should appear transparent.

Figure 7:
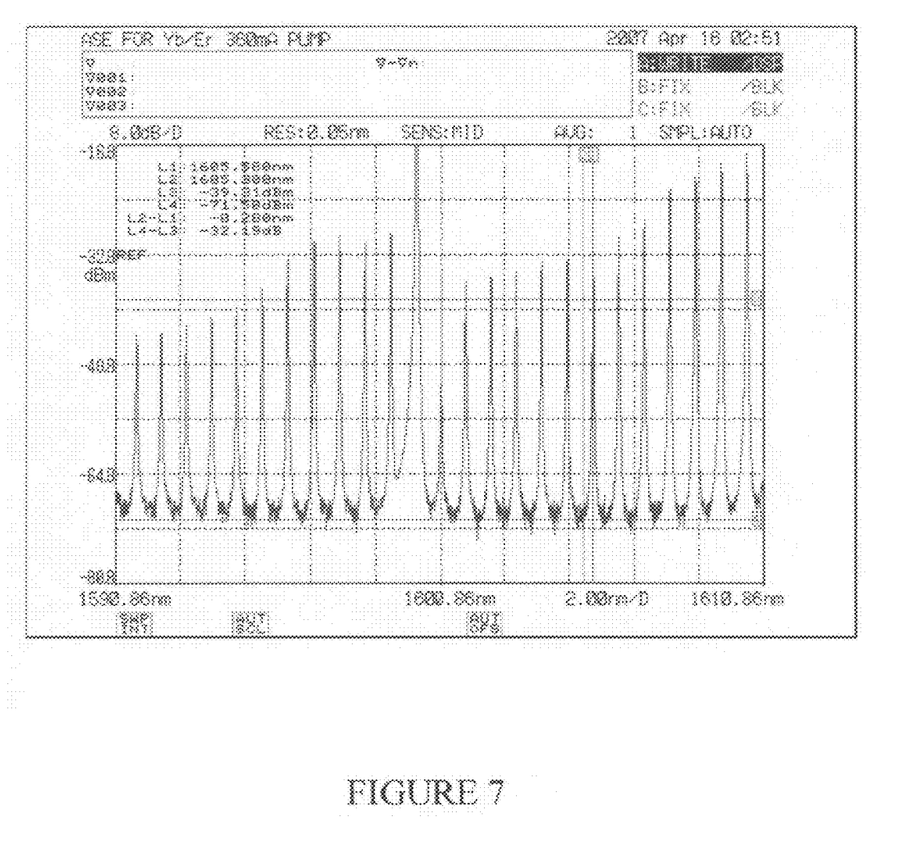
FIG. 7 illustrates the output spectra of an InAs/InGaAsP/InP QD-WMCS based on ND-FWM process in a QD MWLS.

Referring to FIG. 7, the figure provides the output spectra of an InAs/InGaAsP/InP QD-WMCS based on ND-FWM process in a QD MWLS.

A person understanding the above-described invention may now conceive of alternative designs, using the principles described herein. All such designs which fall within the scope of the claims appended hereto are considered to be part of the present invention.

We claim:

1. A quantum-dot based multiwavelength laser system comprising:
    top and bottom cladding layers;
    a Fabry-Perot gain block between said top and bottom cladding layers to define a ridge waveguide structure, said gain block having a plurality of layers of statistically distributed sizes and geometries of self-assembled quantum dots that exhibit an ultra-broad inhomogeneously broadened gain spectrum, said gain block having:
        a first laser end facet coated with a high reflectivity coating and
        a second laser end facet coated with a partially reflective coating, said coatings having a predetermined reflectivity ratio to one another
    wherein said gain block has a predetermined cavity length based on a desired channel spacing between emission peaks of a stable multiwavelength output of said laser, said output having at least 12 channels.

2. A laser system according to claim 1 wherein said desired channel spacing is determined according to:

$$\Delta\lambda(\lambda) = \lambda^2/[2 \cdot n_{eff}(\lambda, T, J) \cdot L]$$

where $\Delta\lambda$ is the the channel spacing,
$\lambda$ is the vacuum wavelength,
T is the device temperature,
J is the injection current density,
L is the cavity length, and
$n_{eff}(\lambda, T, J)$ is a function of $\lambda$, T, J and which represents an effective refractive index.

3. A laser system according to claim 1 wherein the self-assembled quantum dots are grown by chemical beam epitaxy on exactly oriented (100) InP n-type substrates, said gain block having undoped active regions comprising a plurality of stacked layers of self-assembled InAs quantum dots with $In_{0.816}Ga_{0.184}As_{0.392}P_{0.608}$ (1.150) barriers.

4. A laser system according to claim 3 wherein said top cladding layer comprises a p-InP top cladding layer, said top cladding layer being covered with a cap of $p^+$-$In_{0.522}Ga_{0.478}As$.

5. A laser system according to claim 3 wherein said plurality of stacked layers of InAs quantum dots comprises 5 layers of self-assembled InAs quantum dots.

6. A laser system according to claim 1 wherein said multiple layers of self-assembled quantum dots comprise 2 to 50 layers of self-assembled quantum dots.

7. A laser system according to claim 1 wherein said gain block functions as an inhomogeneously broadened active gain medium, a bandpass filter for longitudinal modes, a polarization maintaining component, and cavity mirrors.

8. A laser system according to claim 1 wherein said laser system is used in a wavelength multicasting system, the wavelength multicasting system further comprising:
    input means for receiving an input data optical signal at a frequency $v_0$;
    an optical circulator for: receiving said input data signal: sending said input data signal to said multiwavelength laser system; receiving a replicated multiwavelength signals from said multiwavelength laser system, and rerouting said multiwavelength signals to different destinations.

9. A method for multicasting an optical input data signal to different optical wavelengths, the method comprising:
    a) receiving an input optical data signal at a frequency $v_0$;
    b) transmitting said input optical data signal to a quantum dot based multiwavelength laser system;
    c) receiving multiple wavelength signals which replicate data in said input optical data signal from said quantum dot based multiwavelength laser system.

10. A method according to claim 9 wherein said quantum dot based multiwavelength laser system comprises:
    top and bottom cladding layers;
    a Fabry-Perot gain block between said top and bottom cladding layers, said gain block having a plurality of layers of statistically distributed sizes and geometries of self-assembled quantum dots that exhibit an ultra-broad inhomogeneously broadened gain spectrum, said gain block having:
        a first laser end facet coated with a high reflectivity coating and
        a second laser end facet coated with a partially reflective coating, said coatings having a predetermined reflectivity ratio to one another such that said gain block has a ridge waveguide structure;
    wherein said gain block has a predetermined cavity length based on a desired channel spacing between emission peaks of a stable multiwavelength output of said laser, said output having at least 12 channels.

11. A method according to claim 10 wherein said desired channel spacing is determined according to:

$$\Delta\lambda(\lambda) = \lambda^2/[2 \cdot n_{eff}(\lambda, T, J) \cdot L]$$

where $\Delta\lambda$ is the the channel spacing,
$\lambda$ is the vacuum wavelength,
T is the device temperature,
J is the injection current density,
L is the cavity length, and
$n_{eff}(\lambda, T, J)$ is a function of $\lambda$, T, J, and which represents an effective refractive index.

12. A method according to claim 9 wherein said quantum dot multiwavelength laser is based on non-degenerate four-wave mixing (ND-FWM) process.

13. A method according to claim 12 further including the step of optimizing said ND-FWM process for said quantum dot multiwavelength laser system by ensuring that a state of polarization of said input optical data signal is partially or fully parallel to a state of polarization of said quantum dot multiwavelength laser system.

14. A method according to claim 12 further including the step of optimizing said ND-FWM process for wavelength up-conversion by ensuring that a wavelength of said input optical data signal is longer than a longest wavelength of said quantum dot multiwavelength laser system.

15. A method according to claim 12 further including the step of optimizing said ND-FWM process for wavelength down-conversion by ensuring that a wavelength of said input optical data signal is shorter than a shortest wavelength of said quantum dot multiwavelength laser system.

16. A method according to claim 10 wherein an operational wavelength range of said first laser end facet coated with said high reflectivity coating includes wavelengths of said multiwavelength laser system and wavelengths of non-degenerate four-wave mixing signals.

17. A method according to claim 10 wherein an operational wavelength of said second laser end facet coated with said partially reflective coating includes wavelengths of said multiwavelength laser system and said partial reflectivity coating is transparent to wavelengths of non-degenerate four-wave-mixing signals.

18. A method according to claim 10 wherein the self-assembled quantum dots are grown by chemical beam epitaxy on exactly oriented (100) InP n-type substrates, said gain block having undoped active regions comprising a plurality of stacked layers of self-assembled InAs quantum dots with $In_{0.816}Ga_{0.184}As_{0.392}P_{0.608}$ (1.15 Q) barriers.

19. A laser system according to claim 1 wherein said at least 12 channels are aligned to a 50 GHz or 100 GHz International Telecommunications Union grid.

20. A laser system according to claim 1 wherein said at least 12 channels have an optical signal-to-noise ratio larger than 53 dB and small spectral linewidths.

* * * * *